(12) United States Patent
Takahara et al.

(10) Patent No.: US 7,651,826 B2
(45) Date of Patent: Jan. 26, 2010

(54) SEMICONDUCTOR DEVICE, FABRICATING METHOD THEREOF, AND PHOTOMASK

(75) Inventors: Mika Takahara, Aizuwakamatsu (JP); Tohru Higashi, Aizuwakamatsu (JP); Shigehiro Toyoda, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/291,318

(22) Filed: Nov. 30, 2005

(65) Prior Publication Data
US 2006/0246359 A1 Nov. 2, 2006

Related U.S. Application Data

(63) Continuation of application No. PCT/JP2004/017810, filed on Nov. 30, 2004.

(51) Int. Cl.
*G03C 5/00* (2006.01)
*G03F 9/00* (2006.01)

(52) U.S. Cl. .......................... 430/30; 430/22; 430/312; 382/145; 382/151

(58) Field of Classification Search .................. 430/22, 430/30, 312; 382/145, 151
See application file for complete search history.

(56) References Cited

U.S. PATENT DOCUMENTS 6,797,443 B2 * 9/2004 Nakao et al. .................. 430/30

FOREIGN PATENT DOCUMENTS

| JP | 6-302492 | 10/1994 |
|----|----------|---------|
| JP | 9-036023 | 2/1997 |
| JP | 11-102061 | 4/1999 |
| JP | 12-133569 | 5/2000 |
| JP | 13-358059 | 12/2001 |

* cited by examiner

*Primary Examiner*—Christopher G Young

(57) ABSTRACT

There is provided a semiconductor device including a wafer and a focus monitoring pattern formed on the wafer. The focus monitoring pattern having at least one pair of first and second patterns, and the first pattern has an unexposed region surrounded by an exposed region, and the second pattern has an exposed region surrounded by an unexposed region. In addition, the present invention provides a method of fabricating a semiconductor device comprising the steps of forming at least one pair of first and second patterns on a wafer, the first pattern having an unexposed region surrounded by an exposed region, the second pattern having an exposed region surrounded by an unexposed region, and checking a focusing condition on exposure by measuring widths of the first and second patterns formed on the wafer.

7 Claims, 16 Drawing Sheets

SEMICONDUCTOR DEVICE, FABRICATING METHOD THEREOF, AND PHOTOMASK

CROSS-REFERENCES TO RELATED APPLICATIONS

This is a continuation of International Application No. PCT/JP2004/017810, filed Nov. 30, 2004 which was not published in English under PCT Article 21(2).

BACKGROUND OF THE INVENTION

1. Field of the Invention

This invention generally relates to semiconductors and fabricating methods thereof, and more particularly, to a photomask and a focus monitoring in the photolithography process and to a technique for fabricating a semiconductor device by monitoring a slant of an image plane of projection exposure.

2. Description of the Related Art

With the miniaturization of the pattern used for fabricating semiconductor devices, the error margin becomes smaller for exposure conditions such as focal depth (focus) or light amount adjustment in the photolithography process for pattern transfer. Hence, there is a need for a method of monitoring the exposure conditions with high accuracy.

FIGS. 1A through 1C are cross-sectional views qualitatively illustrating the relationship between an exposure amount and a pattern width. FIG. 1A shows an appropriate exposure amount. FIG. 1B shows an excessive (over) exposure amount. FIG. 1C shows an insufficient (under) exposure amount. FIGS. 1A through 1C respectively illustrate resist patterns (11a through 11c) obtained by exposure. Here, a reference numeral 10 represents a substrate on which the resist is applied. As shown in FIGS. 1A through 1C, a narrower pattern is obtained in the excessive exposure amount (FIG. 1B) than that of the appropriate exposure amount (FIG. 1A). On the contrary, a wider pattern is obtained in the insufficient exposure amount (FIG. 1C) than that of the appropriate exposure amount (FIG. 1A). It is common to monitor the exposure amount by monitoring the pattern width, thereby giving feedback of the monitoring result to the control for the exposure amount in order to avoid a change in the device characteristics or a defect caused by variation in the pattern width.

FIGS. 2A through 2C are schematic views qualitatively illustrating the relationship between focus (misalignment) and a cross-sectional shape. FIG. 2A shows an appropriate focus amount (best focus). FIG. 2B shows an excessive focus amount (over focus). FIG. 2C shows an insufficient focus amount (under focus). FIGS. 2A through 2C respectively illustrate resist patterns (21a through 21c) obtained by exposure. As shown in FIG. 2A, a pattern of a trapezoid having an upper base shorter than a lower base is obtainable in the best focus. On the contrary, a pattern of a (reverse) trapezoid having the upper base longer than the lower base is obtained in the over focus case as shown in FIG. 2B. Also, in the under focus case as shown in FIG. 2C, the upper base becomes "rounded", resulting in an upwardly curved pattern. In this manner, variation of the focus amount from the appropriate amount largely affects the pattern shape to be formed. Therefore, it is extremely important to control the focus amount. However, as shown in FIGS. 2A through 2C, even if the focus amounts vary from the appropriate value, a defect in the pattern can be seen only on the lower base (bottom) or in an upper portion. This is rarely recognized as a defect in the line width of the pattern if the pattern is monitored from above the wafer with the use of the method of pattern recognition. This is the reason why a monitoring method is needeed to effectively monitor misalignment from the appropriate focus.

FIG. 3 is a flowchart explaining an overview of an example of a conventional focus monitoring method. In the conventional focus monitoring method, a pattern most susceptible to the influence of the focusing condition is selected from among the patterns formed on the semiconductor device during the fabrication process, and the line width of the pattern is measured. Specifically, first, the exposure process is performed on the product (step S301). The pattern most susceptible to the influence of the focusing condition is selected from among the patterns obtained and the line width thereof is measured (step S302).

The line width of the pattern is compared with a design value (step S303). If the line width of the pattern is equal to the design value (step S303: Yes), the product is forwarded to the next stage of the process (step S309). In contrast, if the line width of the pattern is different from the design value (step S303: No), it is determined that the exposure amount or the focus amount is not appropriate. A new exposing condition is set again with parameters for the exposure amount and the focus value (step S304). Then, the appropriate exposure amount and focus value are obtained (step S305), and it is judged whether or not the focusing condition in step S301 is different from the appropriate focus (step S306).

If the focusing condition is judged inappropriate (step S306: Yes), the cause of the misalignment in focus is investigated, specified, and modified to set the appropriate focusing condition (step S307), and then the product is forwarded to the next stage of the process (step S309). In contrast, if the focusing condition is judged appropriate (step S306: No), it is considered that the exposure amount is different from the appropriate value and the exposure value is corrected (step S308), and then the product is forwarded to the next stage of the process (step S309).

In addition to the monitoring method of the above-described exposing condition with a high degree of accuracy, there is another extremely important technique in semiconductor fabrication which is the method of monitoring the slant of an image plane at the time of projection exposure. It is a precondition for ensuring high yields that the whole surface of the wafer is properly exposed for mounting a number of chips on a wafer having a large diameter. Originally, the wafer is "distorted" such as warp or bow caused by wafer production and, in addition, may newly be distorted by thermal processing during the fabrication process. This is a problem because it is not always easy to set the wafer to be projected and exposed flat relative to a lens (optical system) mounted on a photolithography machine.

Conventionally, there has been employed a method of monitoring the slant of the image plane to be projected and exposed with the use of a test wafer (a method for measuring the plane to adjust the leveling). For example, "ink baking" of various marks is a known method. This "ink baking" is a method for exposing an extremely small area in an extremely small step while the focus is being changed little by little. Specifically, the pattern for monitoring arranged on the reticle is baked in the extremely small area in the extremely small step while the focus is being changed. The extremely small area is baked so as, as much as possible, to not be affected by the curvature of the image plane (curvature caused resulting from, for example, wafer curvature, nonuniform resist application, and the distribution in development) in an effective range for baking.

FIGS. 4A through 4C are views illustrating examples of the patterns used for monitoring the slant of the image plane and dependency of the line width of the pattern on the focus amount. Here, in the drawings, the reference numeral 10 represents the substrate and reference numerals 41 and 42 represent patterned resists. If the patterns, as shown in FIGS. 4A and 4B as top views, are adjacently provided to the wafer surface and baked by changing the focus amount by a certain amount every time, the line widths (such as L1 and L2) vary according to the focus amount. This is because the line width of the pattern has the maximum value when exposed in the best focusing condition (zero in the focus misalignment) and the line width becomes narrower during the under focus or over focus condition, once the best focusing condition is not met. Therefore, the best focus point corresponds to a peak in the correlation curve of the focus amount and the line width of the pattern, which is obtained by changing the focus amount by a certain amount every time. In other words, it is possible to know the best focus point by exposing multiple marks with different focuses and measuring the line widths of the pattern obtained.

FIG. 5 is a view illustrating an example of monitoring the slant of the image plane with the use of the dependency of the line width of the pattern on the focus amount. Multiple chip patterns are baked in an exposure region 50 to be exposed by one shot (a single exposure step). In this drawing, the exposure region 50 for one shot includes the slant of the image plane. Assuming that points A and B are in the best focusing condition from among four corners of the exposure region, yet on the other hand, points C and D are in the over focusing condition.

The conventional focus monitoring method is configured to compare the pattern width and the design value, as described above. Therefore, it is difficult to know whether the exposure amount or the focus amount is different from the appropriate value, since both affect the variation in the pattern width. This leads to the problem that a complicated procedure is necessary for finding the appropriate focusing condition by using the wafer having the parameters of the exposure amount and the focus amount. That is to say, it is difficult to sense the "difference" from the appropriate value immediately, even if the focusing condition is not equal to the appropriate value in the conventional focus monitoring method. This complicates the fabrication process of the semiconductor device and degrades the throughput.

In addition, in the conventional method of monitoring the slant of the image plane, a large part of the shots result in multi-exposure, because the marks to be included in the periphery or inside of the exposure region are exposed in an extremely small area. However, the afore-mentioned multi-exposure is not performed on the device region of the wafer of the product, and the mark used for checking the leveling cannot be baked in the product reticle. This is the reason why the establishment of a monitoring method with the use of the product reticle is needed so that the flatness (the slant of the image plane) of the photolithography machine used for exposing the surface of the wafer in an actual product to be affected by a factor such as distortion of the wafer or slant of the stage can be monitored relative to the lens system (optical system). That is to say, a monitoring method is needed to monitor the slant of the image plane of an actual product during the fabrication process.

SUMMARY OF THE INVENTION

The present invention has been made to overcome the above drawbacks of the prior art and provides a highly reliable semiconductor device and a fabricating method thereof in which the focus can be adjusted promptly with the use of a pattern for focus monitoring provided on the photomask and/or a slant of the image plane in a shot can be monitored by a single exposure shot.

According to an aspect of the present invention, there may be provided a semiconductor device including a wafer, and a focus monitoring pattern formed on the wafer, the focus monitoring pattern having at least one pair of first and second patterns, the first pattern having an unexposed region surrounded by an exposed region, and the second pattern having an exposed region surrounded by an unexposed region. On the above-mentioned semiconductor, each of the first and second patterns may have a respective shape having a continuously changing pattern width, each of the first and second patterns having a respective shape with a stepwise changing pattern width, and each of the first and second patterns having a plurality of apexes. The semiconductor device may include multiple pairs of first and second patterns arranged inside and outside of a region exposed by a single exposure step. The semiconductor device may also include multiple pairs of first and second patterns arranged in line. In addition, the semiconductor device may include multiple pairs of first and second patterns arranged in mutually orthogonal directions.

According to another aspect of the present invention, there may be provided a method of fabricating a semiconductor device comprising the steps of forming at least one pair of first and second patterns on a wafer, the first pattern having an unexposed region surrounded by an exposed region, the second pattern having an exposed region surrounded by an unexposed region, and checking a focusing condition on exposure by measuring widths of the first and second patterns formed on the wafer. The step of checking may measure widths of each of the first and second patterns in mutually orthogonal directions. The method may further include a step of changing an exposing condition by using results of checking the focusing condition upon exposure.

According to another aspect of the present invention, there may be provided a method of fabricating a semiconductor device comprising the steps of exposing a substrate by using a photomask having marks for monitoring, each of the marks having a pair of first and second patterns, the first pattern having an unexposed region surrounded by an exposed region, the second pattern having an exposed region surrounded by an unexposed region, determining whether there is a point that is located in an exposed region that meets a best focusing condition by measuring sizes of the marks, and determining the slant of an image plane of the substrate in the exposed region by converting the sizes of the marks into displacements when there is no point that meets the best focusing condition. The step of determining whether there is a point that meets the best focusing condition may include a step of inverting signs of the displacements when there is a point that meets the best focusing condition. The step of determining the slant of the image plane of the substrate may include a step of subjecting the displacements to least square approximation to obtain the slant of the image plane.

According to another aspect of the present invention, there may be provided a photomask including an opening region and a mask region for forming a mark for monitoring, the mark having a pair of first and second patterns, the first pattern having an unexposed region surrounded by an exposed region, the second pattern having an exposed region surrounded by an unexposed region. Each of the first and second patterns may have a respective region having a width narrower than that of a device pattern formed in the photomask. The first and second patterns may be formed in a position corresponding to a dicing area on a wafer.

According to another aspect of the present invention, there may be provided a computer program product comprising the steps as described above.

Thus, in accordance with the present invention, it is possible to adjust the focus promptly by the use of a pattern for focus monitoring provided on the photomask. In addition, it is also possible to monitor the slant of the image plane in a shot by a single exposure shot.

DESCRIPTION OF THE PREFERRED EMBODIMENTS

A description will now be provided, with reference to the accompanying drawings, of embodiments of the present invention.

First Embodiment

A first embodiment relates to a semiconductor device that employs a focus monitoring method and a fabricating method thereof.

Figure 6A:
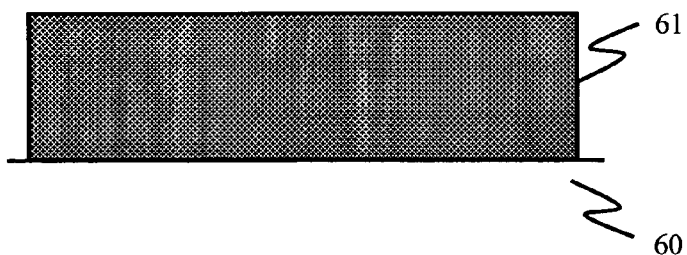
FIGS. 6A through 6C are views of resist illustrating some principles of a focus monitoring method in accordance with the present invention.
Figure 6B:
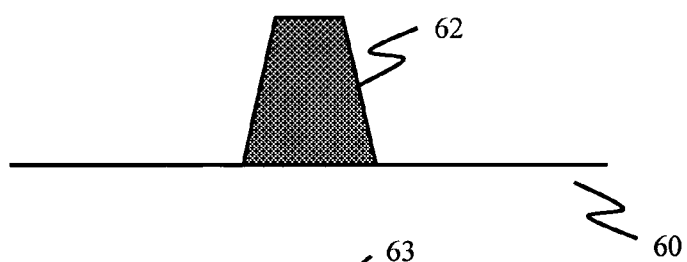
Figure 6C:
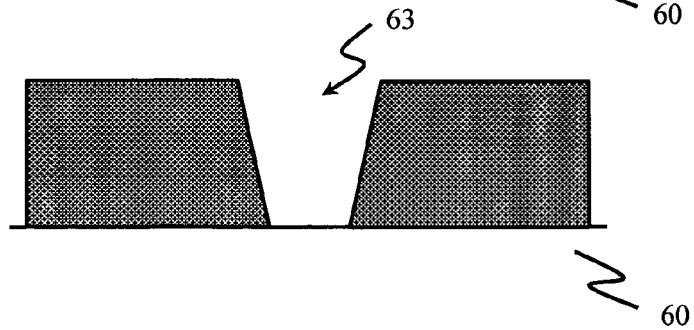

FIGS. 6A through 6C are views illustrating a principle of the focus monitoring method in accordance with the present invention. FIG. 6A shows a sheet of resist 61 provided on a substrate (wafer) 60 before exposure. FIG. 6B shows a "remaining" pattern 62, and FIG. 6C shows a "removed" pattern 63. Here, the "remaining" pattern denotes the pattern obtained by a remaining resist formed during the photolithography process, and the "removed" pattern denotes the pattern obtained by a removed resist formed during the photolithography process. That is to say, the "remaining" pattern means an unexposed region surrounded by the exposed region, and the "removed" pattern means the exposed region surrounded by the unexposed region. The focus monitoring method in accordance with the present invention monitors the difference from the appropriate value of the focus amount during exposure with the use of both the "remaining" and "removed" patterns. A description will be given of the details of the above-mentioned monitoring method.

Figure 7A:
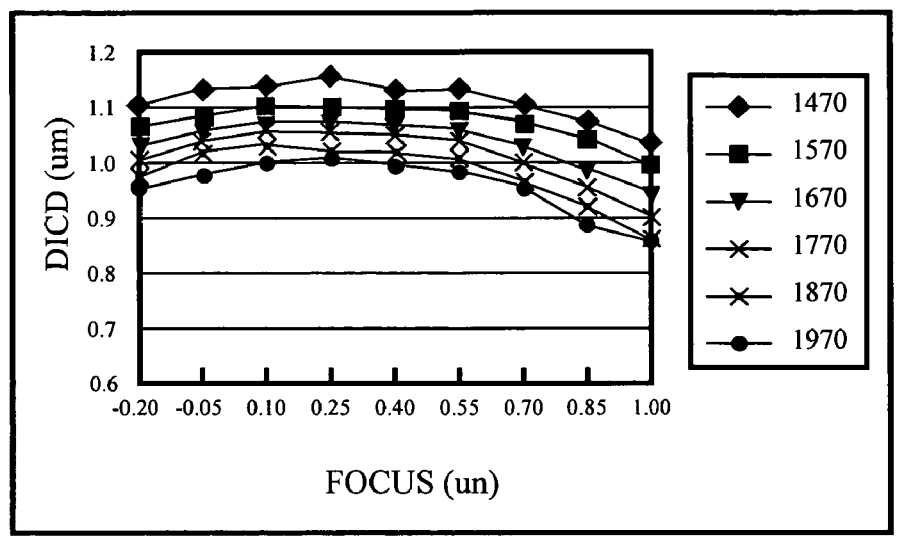
FIGS. 7A and 7B show the relationship between the focus amount and the pattern width (FIG. 7A) and the relationship between the exposure amount and the pattern width (FIG. 7B) in a "remaining" resist pattern.

FIGS. 7A through 9C are views qualitatively illustrating the advantages of the monitoring method in accordance with the present invention. FIGS. 7A and 7B show the relationship between the focus amount and the pattern width (FIG. 7A) and the relationship between the exposure amount and the pattern width (FIG. 7B) in the "remaining" pattern. FIGS. 8A and 8B show the relationship between the focus amount and the pattern width (FIG. 8A) and the relationship between the exposure amount and the pattern width (FIG. 8B) in the "removed" pattern. FIGS. 9A and 9B show the relationship between the focus amount and the pattern width (FIG. 9A) and the relationship between the exposure amount and the pattern width (FIG. 9B) in a combination of the "remaining" pattern and the "removed" pattern, as in accordance with the present invention.

Figure 7B:
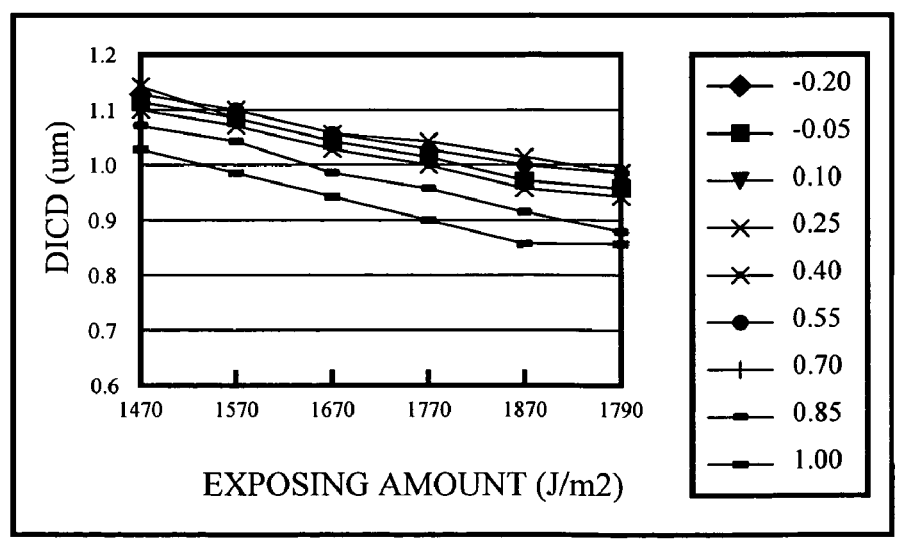
Figure 8A:
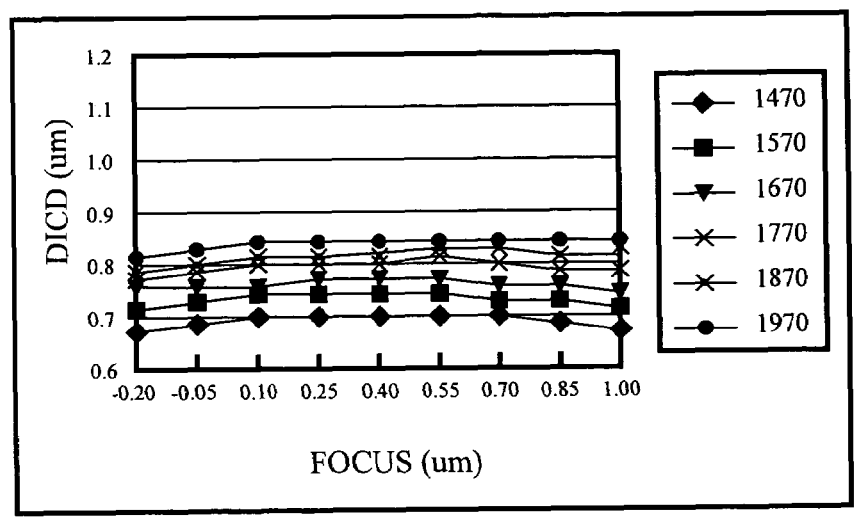
FIGS. 8A and 8B show the relationship between the focus amount and the pattern width (FIG. 8A) and the relationship between the exposure amount and the pattern width (FIG. 8B) in a "removed" resist pattern.
Figure 8B:
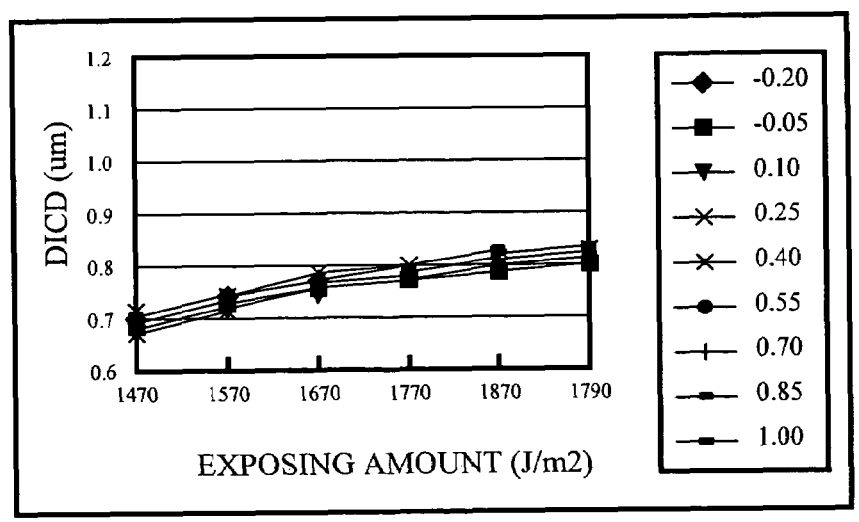

Firstly, referring to FIGS. 7A through 8B, the line width of the "remaining" pattern tends to narrow as the exposure amount increases as shown in FIG. 7B. In contrast, the line width of the "removed" pattern tends to thicken as the exposure amount increases as shown in FIG. 8B. With respect to the influence of the exposure amount on the line width of the pattern, both the "remaining" and the "removed" patterns are capable of obtaining the maximum pattern line width under the appropriate condition (best focus), as shown in FIG. 7A and FIG. 8A. The focus monitoring method of the present invention employs both the dependency of the "remaining" pattern and that of the "removed" pattern on the focus amount and the exposure amount. Both the line width of the "remaining" pattern and that of the "removed" pattern (the width of the mark provided for the focus monitoring) are measured so as to cancel the influence of the exposure amount on the pattern line width. This makes it possible to monitor the focus amount in consideration of only the influence caused by the difference of the focus amount from the appropriate value in the pattern line width.

Specifically, if the line width of the "remaining" pattern is set to $x_1$ and the line width of the "removed" pattern is set to $x_2$, a line width $x_0$ for monitoring is obtained as a linear coupling of the aforementioned pattern line widths and is set to an average thereof $x_0=(x_1+x_2)/2$, so that the appropriate focusing condition may be set on the basis of the dependency of the focus amount and that of the exposure amount on the line width $x_0$ provided for monitoring.

Figure 9A:
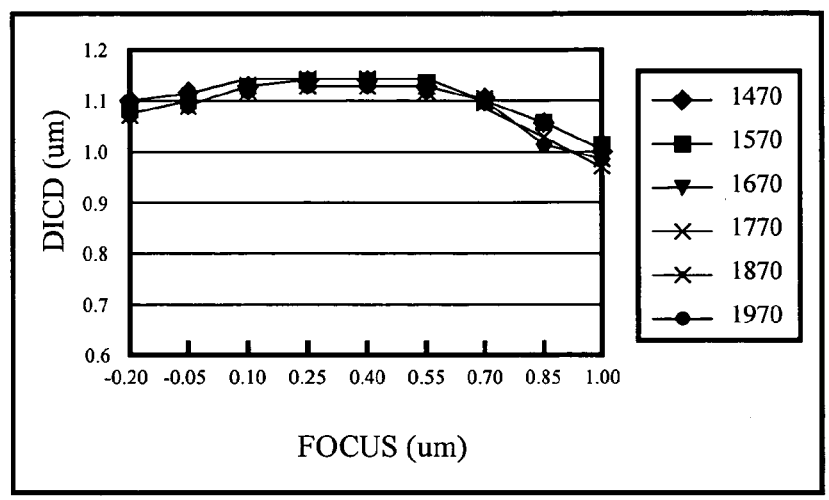
FIGS. 9A and 9B show the relationship between the focus amount and the pattern width (FIG. 9A) and the relationship between the exposure amount and the pattern width (FIG. 9B) in a combination of the "remaining" resist pattern and the "removed" resist pattern in accordance with the present invention.
Figure 9B:
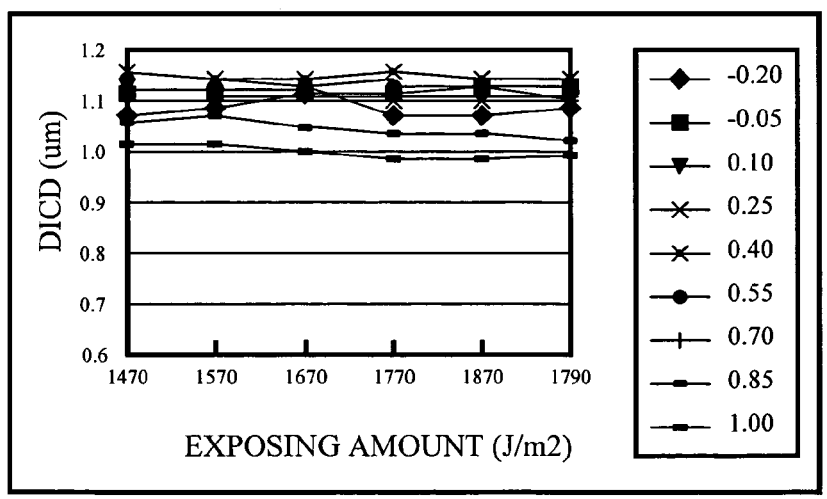

FIGS. 9A and 9B are views illustrating the dependency of the line width $x_0$ provided for monitoring the dependency on the focus amount (FIG. 9A) and that on the exposure amount (FIG. 9B). The line width of the "remaining" pattern tends to narrow as the exposure amount increases as described above, yet the line width of the "removed" pattern tends to thicken as the exposure amount increases. Accordingly, the line width $x_0$ provided for monitoring is not dependent on the exposure amount (FIG. 9B), and only the focus amount affects the line width $x_0$ provided for monitoring (FIG. 9A). Also, with respect to the dependency of the line width $x_0$ provided for monitoring of the focus amount, the line width $x_0$ for monitoring has the maximum value in the best focusing condition (FIG. 9A), which results from the maximum pattern line width in both the "remaining" and "removed" patterns having the appropriate focusing condition (the best focus).

Accordingly, data (focus characteristic data), related to the dependency of the line width $x_0$ provided for monitoring of the focus amount is obtained in advance from the widths of both the "remaining" and "removed" marks provided for the focus monitoring. The widths of the marks obtained by the actual exposure are calculated as the line width $x_0$ for monitoring and compared with the focus characteristic data. This makes it possible to judge whether the exposure is accomplished under the best focusing condition. If there is a difference from the best focus, it is possible to refer to the focus characteristic data and correct the difference.

Figure 10:
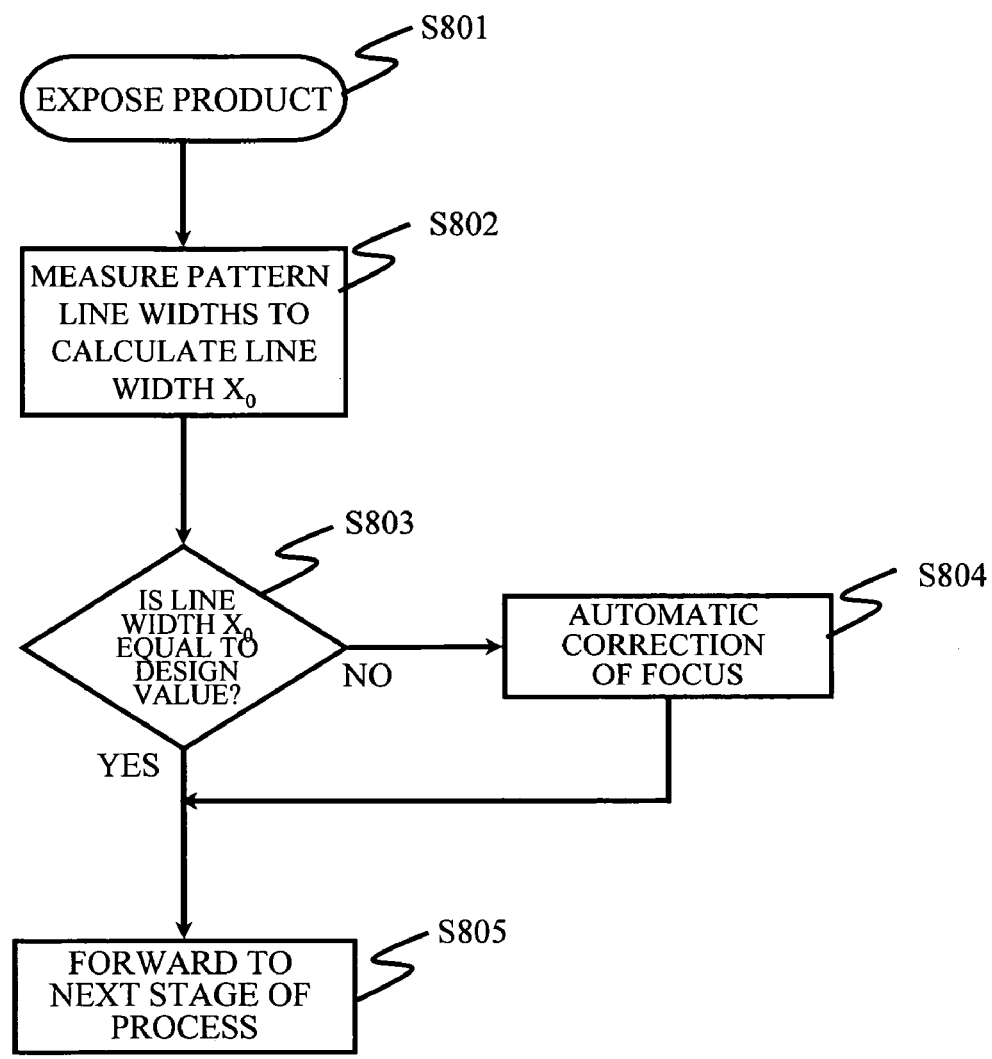
FIG. 10 is a flowchart of a focus monitoring method in accordance with the present invention.

FIG. 10 is a flowchart showing an example of a focus monitoring method in accordance with the present invention. In this focus monitoring method, the pattern is formed by using a photomask having both the "remaining" and the "removed" marks (composed of an opening region and a mask region) provided for the focus monitoring. Specifically, first, the product is exposed (step S801), and the line widths of the "remaining" pattern and "removed" pattern provided for the focus monitoring are measured to calculate the line width $x_0$ provided for monitoring (step S802). This line width $x_0$ provided for monitoring is compared with the above-mentioned focus characteristic data prepared in advance to determine whether the line width $x_0$ provided for monitoring is equal to the design value (step S803).

If the line width $x_0$ is equal to the design value (step S803: Yes), the product is forwarded to the next stage of the process (step S805). In contrast, if the line width $x_0$ is different from the design value (step S803: No), it is determined that the focusing condition is not appropriate and the focusing condition is automatically modified to the appropriate focus value (step S804), then the product is forwarded to the next stage of the process (step S805).

In addition, the line width $x_0$ provided for monitoring does not always have to be equal to the average value $(x_0=(x_1+x_2)/2)$ of the line width of the "remaining" pattern $x_1$ and the line width of the "removed" pattern $x_2$. More generally, the average value $x_0$ is set to satisfy $x_0=(a \cdot x_1+b \cdot x_2)/(a+b)$ so that the dependency of the "remaining" pattern line width $x_1$ on the exposure amount and the dependency of the "removed" pattern line width $x_2$ on the exposure amount may be cancelled and only the focus amount may affect the line width $x_0$ provided for monitoring.

Figure 11A:
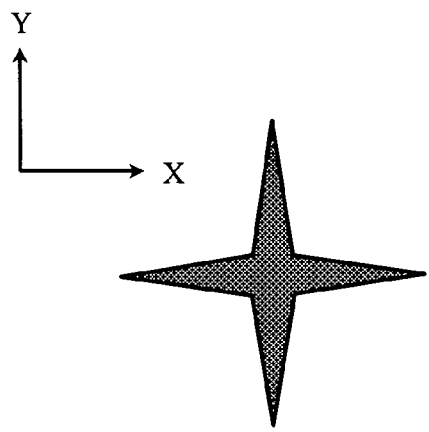
FIGS. 11A through 11D are views illustrating examples of the "remaining" pattern (FIG. 11A) and the "removed" pattern (FIG. 11B) for use in accordance with the present invention.
Figure 11B:
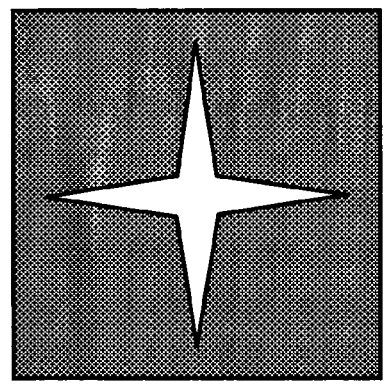
Figure 11C:
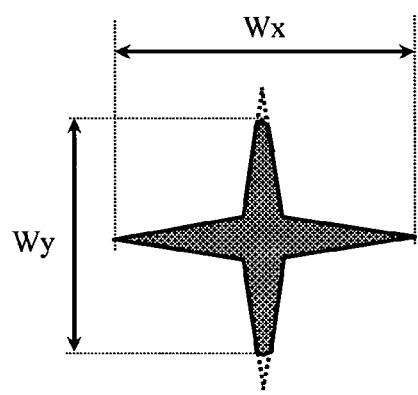
Figure 11D:
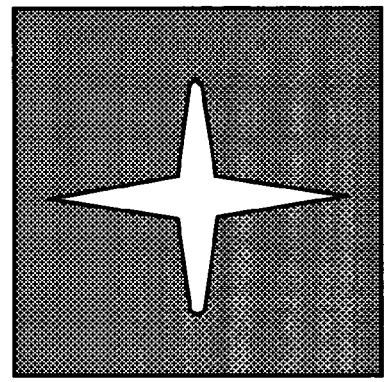

FIG. 11A through FIG. 12D are views illustrating examples of the "remaining" pattern (FIG. 11A) and the "removed" pattern (FIG. 11B). The resist pattern after the exposure is shown by hatching. This shape of mark is provided on the photomask having a device pattern made of the opening portion and mask portion. Next, a description will be given of the mark provided on the photomask by describing the resist pattern.

The marks shown in FIGS. 11A through 11D have apexes in x and y directions. For example, if the focus value is different from the appropriate value in the y direction, tips of the aforementioned direction become dull and the apexes disappear (such as in FIGS. 11C and 11D). Therefore, the pattern width $W_y$ becomes shorter. That is, it is possible to monitor the difference of the focus value in the x direction and that of the focus value in the y direction simultaneously by measuring the pattern widths ($W_x$ and $W_y$) in the x direction and y direction. In addition, the focus in the x and y directions can be monitored with a single mark. The differences in various conditions such as the slanted state of the base (substrate) can be ignored (substantially eliminated) in the x and y directions and, furthermore, space necessary for monitoring can be reduced on the product substrate.

Figure 12A:
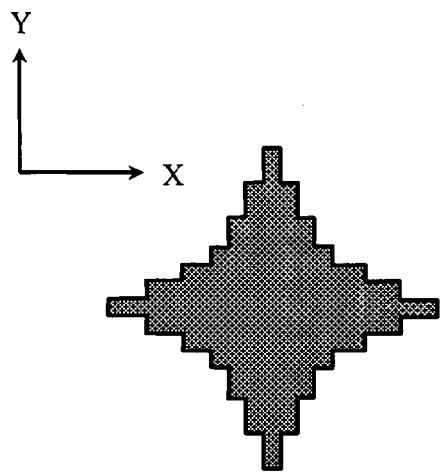
FIGS. 12A through 12D are views illustrating examples of the "remaining" pattern (FIG. 12A) and the "removed" pattern (FIG. 12B) for use in accordance with the present invention.
Figure 12B:
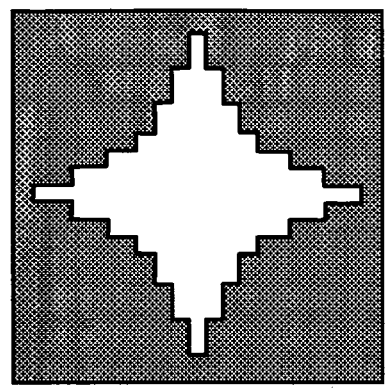
Figure 12C:
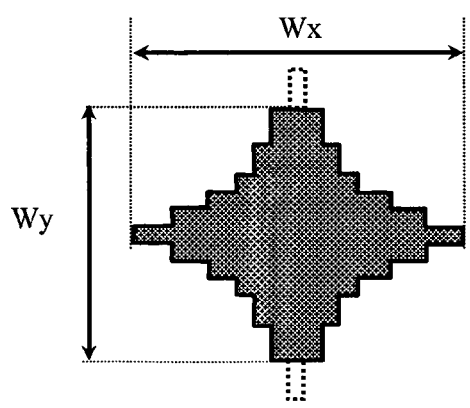
Figure 12D:
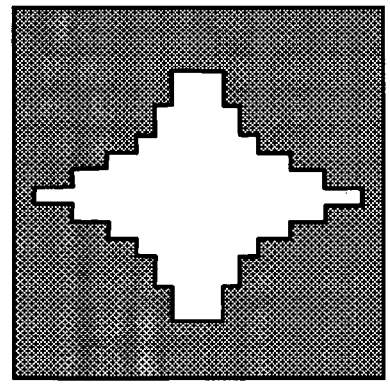

The marks shown in FIGS. 12A through 12D have shapes in which multiple lines having different widths are combined and the line widths are different according to the position in the x direction and y direction (FIGS. 12A and 12B). The marks having pointed projections, as shown in FIGS. 11A through 11D, have sharp tips, and are sensitive to the difference in the appropriate focus. However, if the focus is different, the pattern size decreases. This easily leads to peel-off of the pattern from the base substrate, resulting in the generation of foreign materials. In contrast, if the mark has the shape shown in FIGS. 12A and 12B, it is possible to have a larger area adhering to the base substrate and avoid the peel-off. Also, if the product is exposed in a defocusing condition (for example, a defocus in the y direction), the pointed projections gradually disappear as shown in FIGS. 12C and 12D. This makes it possible to observe wide variation levels of line widths under a defocusing condition.

When a glass lens is employed, the focus in the x direction and in the y direction are dependent on the lens characteristics and cannot be controlled separately. However, when the focus monitoring method in accordance with the present invention is applied to an electron beam exposure, the focuses can be controlled separately and extremely effectively. In addition, while the description has heretofore referred to the "remaining" pattern and the "removed" pattern used for focus monitoring have the same shape (reversed shapes), those shapes do not have to be the same and any combination of shapes may be selected as necessary. Further, any of the "remaining" and "removed" patterns may include at least one region having a line width equal to or smaller than the circuit design rule (design rule) of the semiconductor device.

As described, the mark used for focus monitoring is formed in a desired position on the photomask used in the fabrication process of the semiconductor device. In other words, the photomask in accordance with the present invention includes the above-mentioned mark used for the focus monitoring on a portion thereof. A semiconductor device in accordance with the present invention is patterned and fabricated with use of the above-mentioned photomask. That is to say, there is provided a semiconductor device including a wafer and a focus monitoring pattern formed thereon in accordance with the present invention. The focus monitoring pattern has at least one pair of first and second patterns (FIGS. 11A through 12D). The first pattern has an unexposed region surrounded by an exposed region, and the second pattern has an exposed region surrounded by an unexposed region.

Second Embodiment

A second embodiment in accordance with the present invention relates to a semiconductor device and a fabrication method with the monitoring method of a slant of the image plane.

Figure 1A:
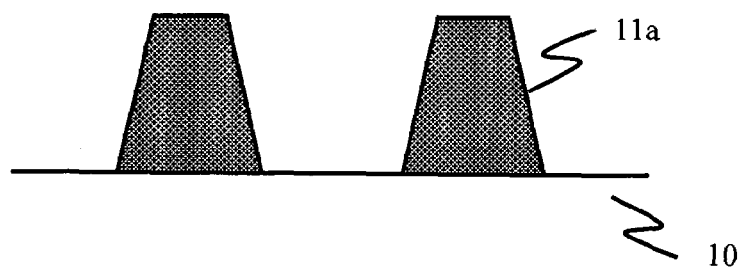
FIGS. 1A through 1C are cross-sectional views qualitatively illustrating the relationship between an exposure amount and a pattern width.
Figure 1B:
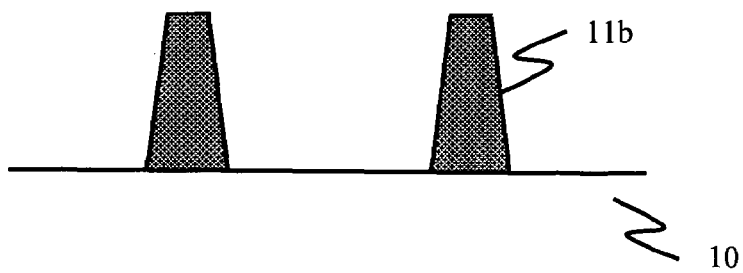
Figure 1C:
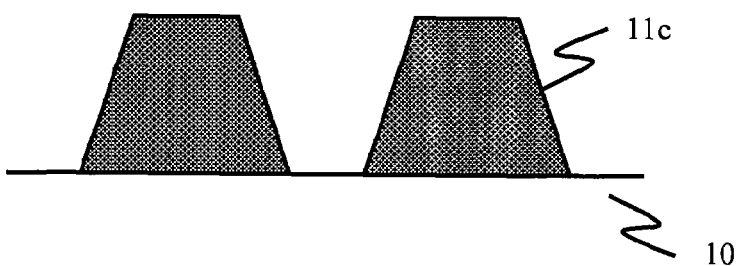
Figure 2A:
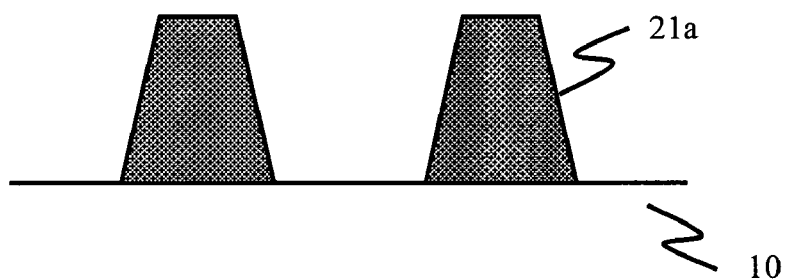
FIGS. 2A through 2C are schematic views qualitatively illustrating the relationship between the focus (misalignment) and a cross-sectional shape.
Figure 2B:
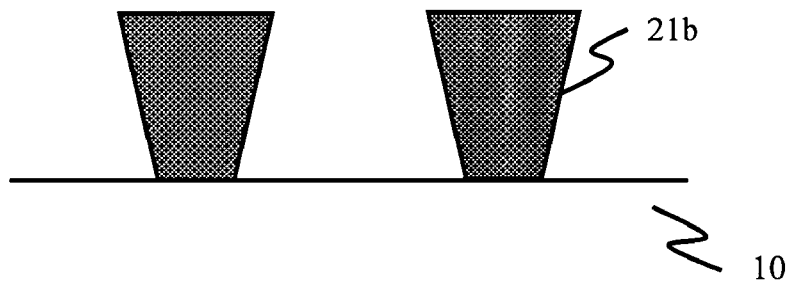
Figure 2C:
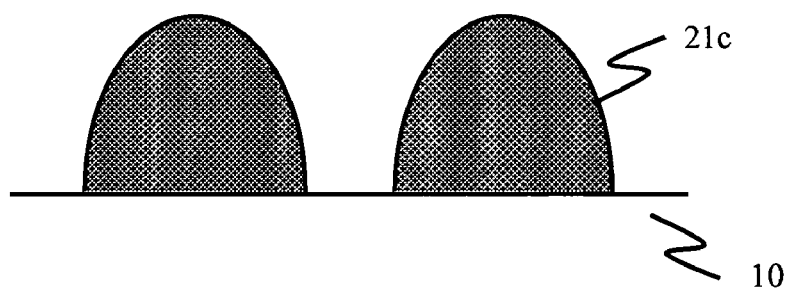
Figure 3:
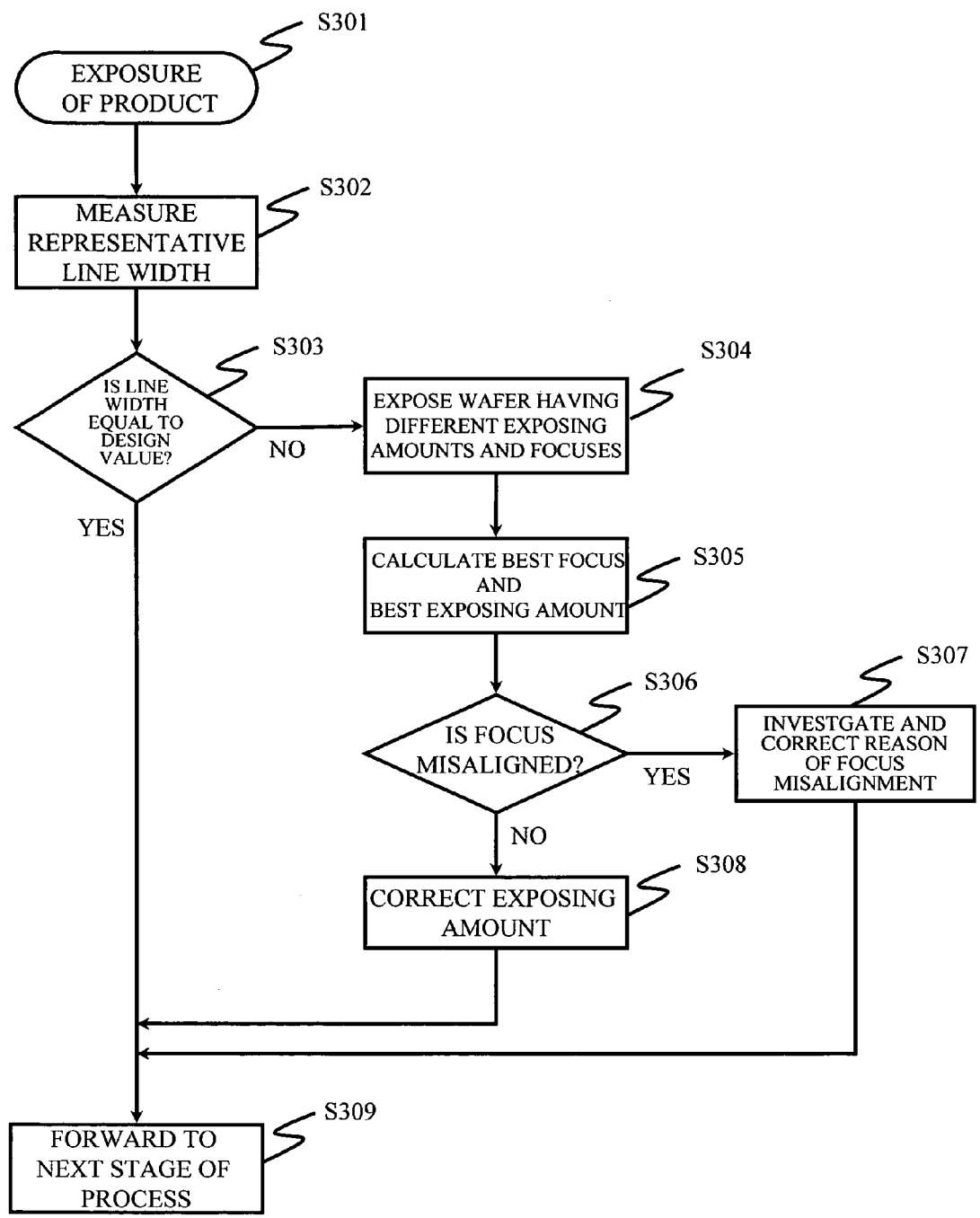
FIG. 3 is a flowchart of an example of a conventional focus monitoring method.
Figure 4A:
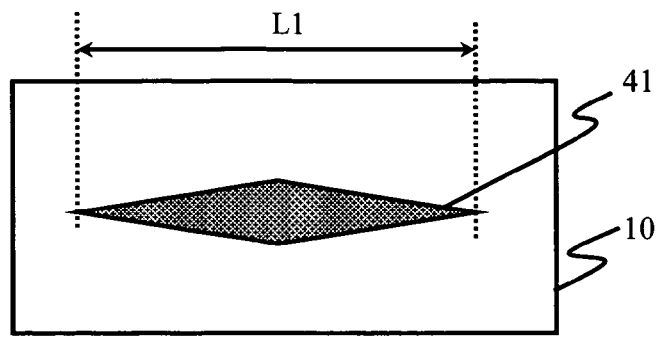
FIGS. 4A through 4C are views illustrating examples of patterns used for monitoring the slant of the image plane and the dependency of the line width of the pattern on the focus amount.
Figure 4B:
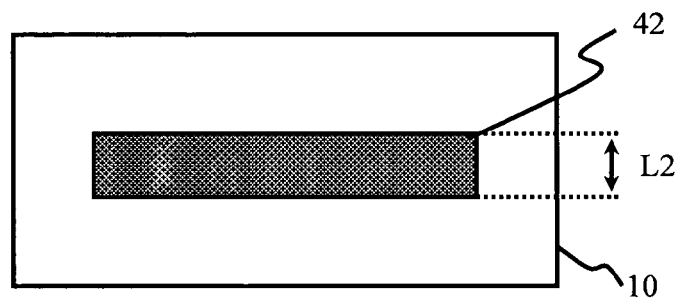
Figure 4C:
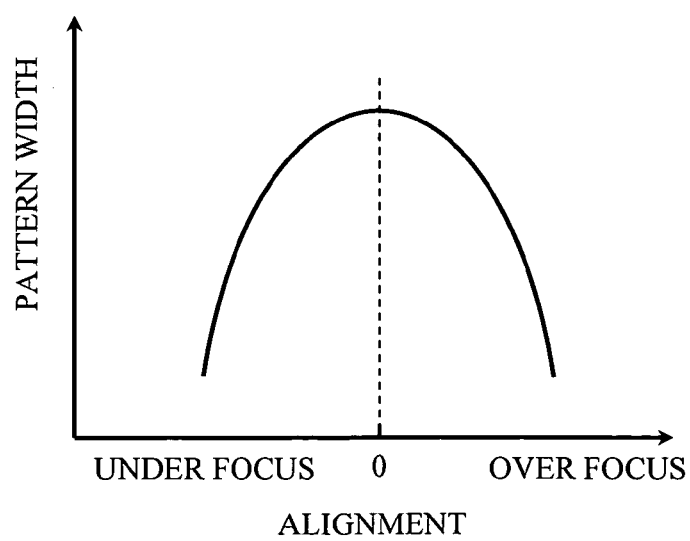
Figure 5:
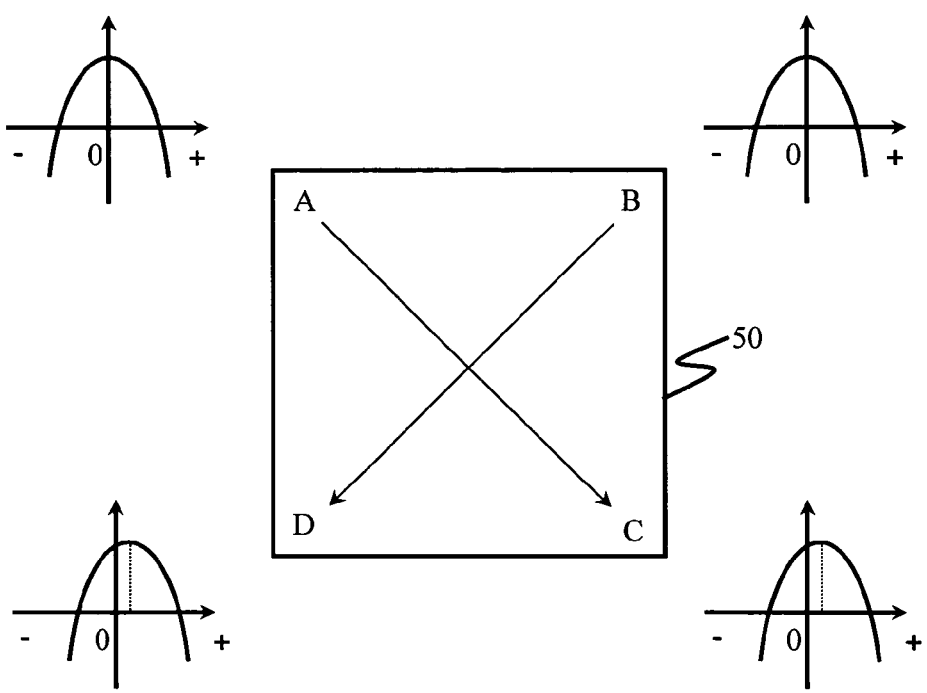
FIG. 5 is a view illustrating an example of monitoring the slant of the image plane with the use of the dependency of the line width of the pattern on the focus amount.
Figure 13A:
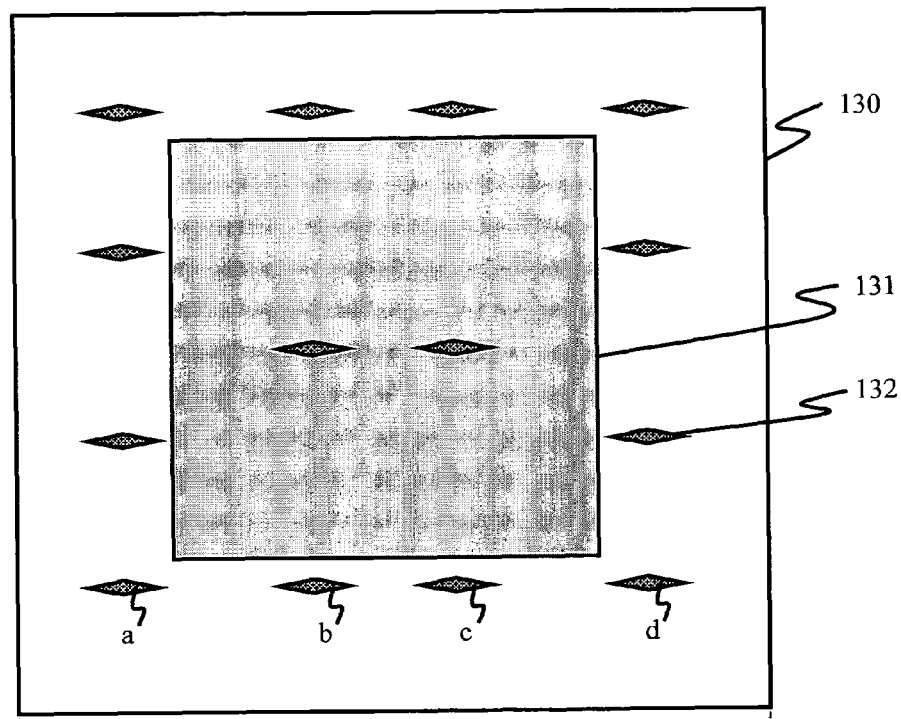
FIGS. 13A and 13B illustrate a one-shot exposure with multiple marks used for the method of monitoring a slant of the image plane in accordance with the present invention.
Figure 13B:
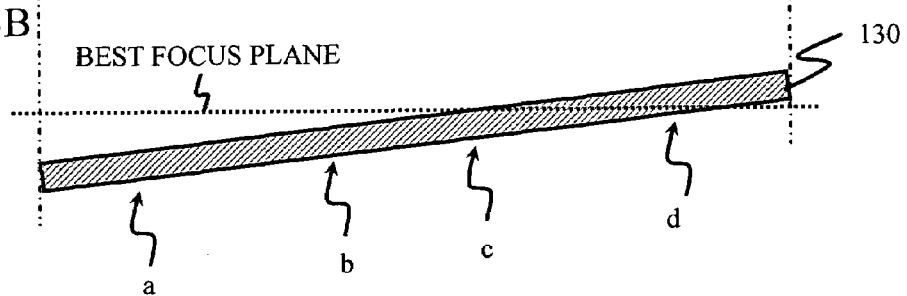

FIGS. 13A and 13B illustrate a one-shot exposure with multiple marks used for the method of monitoring a slant of the image plane. FIG. 13A is a top view and FIG. 13B is a side view. Marks for monitoring 132 are provided on the photomask used for the projection exposure and are projected in a layout on a base substrate 130 as shown in the drawings. A one-shot region 131 is configured to include patterns in a cycle corresponding to multiple chips therein and the shapes of the patterns are shown as FIG. 4A, for example. This example, as shown in FIGS. 13A and 13B, includes twelve marks 132 for monitoring in a periphery of the one-shot region 131 and two marks 132 for monitoring in the one-shot region 131. Fourteen marks are provided in total. Preferably, the marks 132 for monitoring provided in the one-shot region 131 are arranged in an empty space such as a scribe line used for dividing into respective chips (dummy space that does not affect the device patterning of the chip).

Figure 14A:
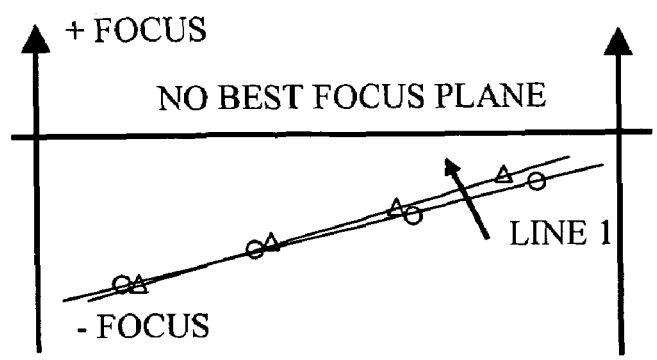
FIGS. 14A and 14B show examples in which mark sizes of points a through d are plotted in a case where the image plane to be shot is slanted as shown in FIG. 13B in accordance with the present invention.
Figure 14B:
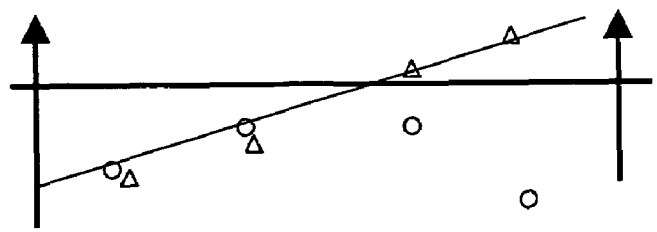

FIGS. 14A and 14B show examples in which mark sizes of points a through d are plotted in a case where the image plane to be shot is slanted as shown in FIG. 13B. If there is a slant on the image plane, two cases can be considered: where there is no best focusing condition in any of the positions as shown in FIG. 14A and where there is a best focusing condition in the positions as shown in FIG. 14B. However, as described above, the pattern line width has the maximum value under the best focusing condition and the line width becomes narrower than the maximum value if the focusing condition is in either the under focusing condition or the over focusing condition. The profile of the focusing condition makes it possible to exhibit whether the best focus position stays on the plane and also exhibit the position thereof if the best focus position stays on the plane. In these drawings, circle symbols denote the mark sizes for the respective points and the triangle symbols denote the values after the mark sizes are converted into the displacement in the z position for the respective points (z displacement amounts for the respective points). If there is no best focusing condition in any of the positions as shown in FIG. 14A, the amounts of slant in the points a through d are obtainable by a slanted straight line relative to the image plane which is calculated by a least square approximation on the basis of the z displacement amounts of the four points. On the other hand, if there is a best focusing condition in any of the positions, the slant amount from the points a through d is obtainable as described hereafter.

Figure 15A:
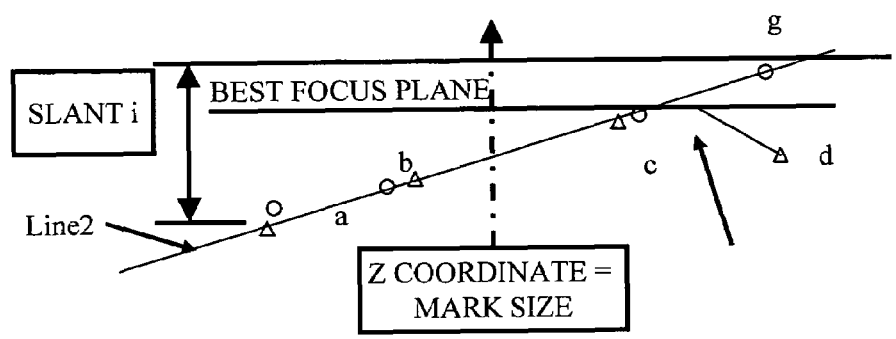
FIGS. 15A and 15B are views illustrating the method of obtaining the slant amount of the image plane in accordance with the present invention if there is a best focusing condition in any of the points a through d.
Figure 15B:
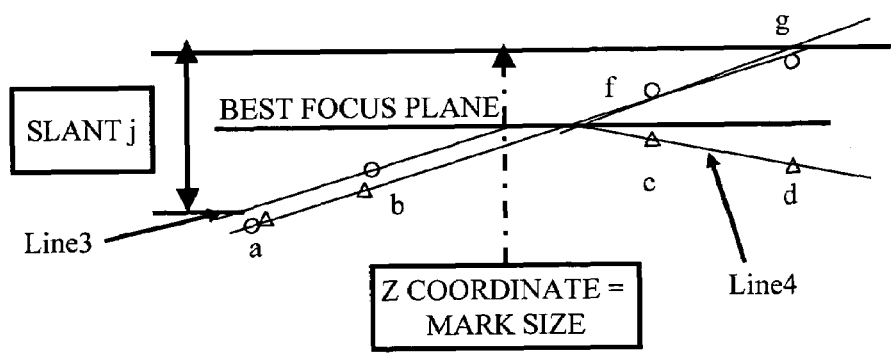

FIGS. 15A and 15B are views illustrating the method of obtaining the slant amount of the image plane in accordance with the present invention if there is a best focusing condition in any of the points a through d. In this case, the maximum value of the mark size is between the points b and c. Firstly, as shown in FIG. 15A, if the linearity can be seen in the z displacement amount among the points a, b, and c, a virtual point g is provided after inverting the sign of the z displacement amount of the point d. The slanted straight line relative to the image plane is calculated by the least squares approximation on the basis of the z displacement amounts of the points a, b, c, and g. Then, the slant amount of the image plane ranging from the point a to the point d is estimated with a slanted straight line relative to the image plane. Whether there is a linearity of the z displacement amount among the points a, b, and c is determined by comparing a predetermined parameter $\alpha$ with the difference ($\Delta z$) on the point b in the z displacement amount from the straight line connecting the z displacement amounts of the points a and c. If $\Delta z <= \pm \alpha$, it is considered that there is a linearity, and if $\Delta z > \pm \alpha$, the linearity cannot be observed and the following process is carried out.

FIG. 15B is a view illustrating the process of obtaining the slant amount of the image plane in accordance with the present invention if the linearity cannot be observed in the z displacement amounts among the points a, b, and c. In this case, virtual points f and g are provided after inverting the signs of the z displacement amounts on the points c and d. The slanted straight line relative to the image plane is calculated by the least squares approximation on the basis of the z displacement amounts on the points a, b, f, and g. Then, the slant amount of the image plane from the point a through the point d is estimated with a slanted straight line relative to the image plane that has been calculated.

In this manner, it is possible to monitor the slant of the image plane with the marks formed by one baking on the wafer.

Figure 16:
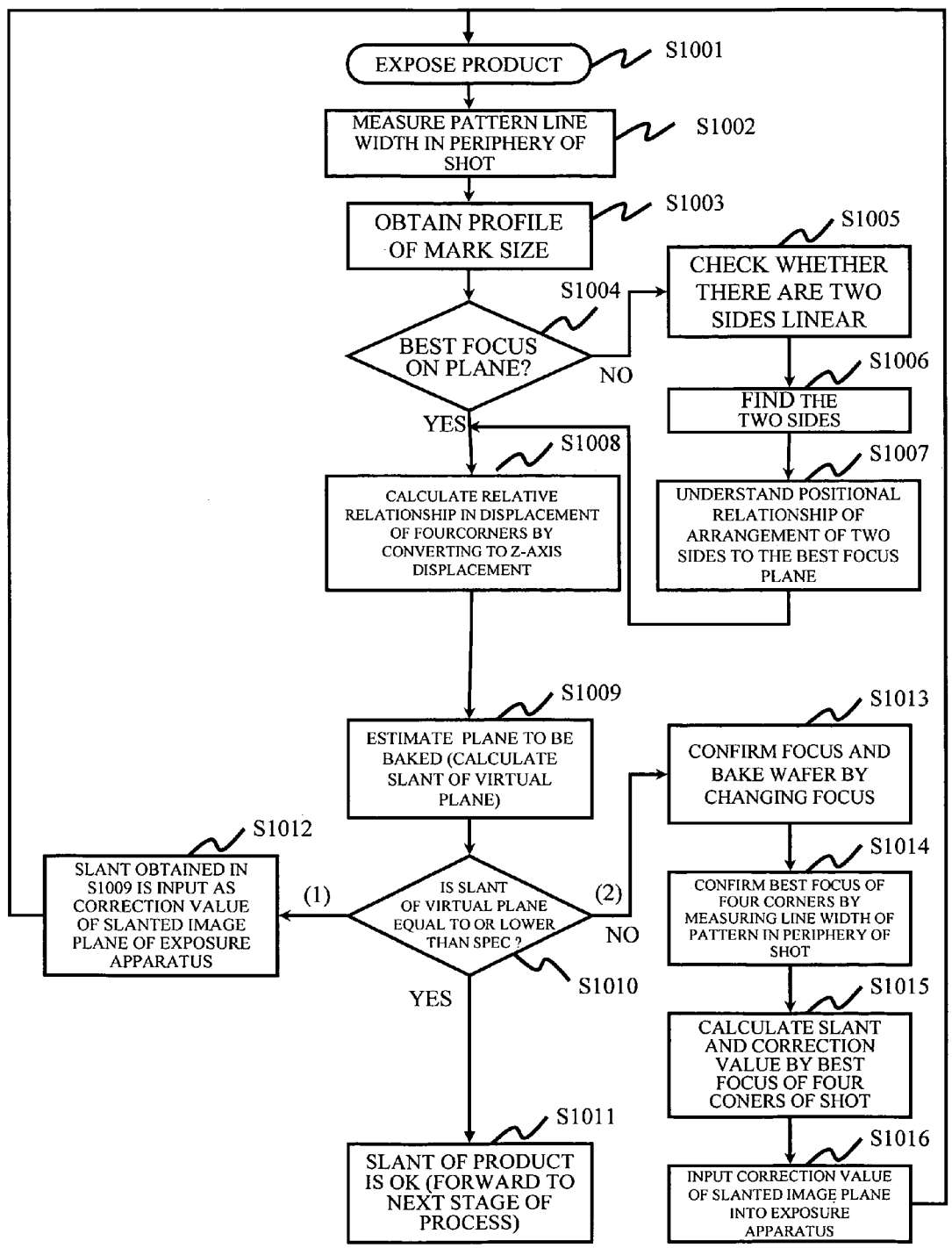
FIG. 16 is a flowchart illustrating the procedure of the method of monitoring the slant of the image plane in accordance with the present invention.

FIG. 16 is a flowchart illustrating the procedure of the method of monitoring the slant of the image plane in accordance with the present invention. First, the product is exposed with the use of the photomask having the marks for monitoring thereon as described (step S1001). The pattern line width (mark size) in the periphery of the shot is measured (step S1002). The profile of the mark size is obtained (step S1003) and whether there is any point corresponding to the best focusing condition on the plane is determined (step S1004).

If there is a point corresponding to the best focusing condition on the plane (step S1004: Yes), processing goes to step S1008. In contrast, if there is not a point of the best focusing condition on the plane (step S1004: No), the four sides surrounding the shot region are checked to find two sides that are linear in the change of the mark size (step S1005), and these two sides are selected (step S1006). The positional relationship of the image plane relative to the best focus plane is figured out with the arrangement of the two sides (step S1007), and processing goes to step S1008.

At step S1008, the amount of change in the mark size is converted into the z displacement amount to estimate in advance the calculation of the relative relationship in the z displacement of the four corners of the shot region. Then, the slant of the image plane (virtual plane) to be baked thereon is calculated with the converted value of the z displacement amount of the four corners (step S1009). It is next determined whether the slant of the virtual plane is equal to or smaller than the predetermined value (step S1010). If the slant is equal to or smaller than the predetermined value (step S1010: Yes), the product is forwarded to the next stage of the process (step S1011). In contrast, if the slant is larger than the predetermined value (step S1010: No), either one of the following two processes is selected, and processing goes back to the product exposure (step S1001).

Specifically, there are two cases: the feedback is given on the basis of the measured value (case 1) and the feedback is given by obtaining the correction value to the slant in an actually implemented method (case 2). According to the case selected, the following procedure is performed.

In case 1, the slant obtained by the baked pattern in step S1009 is input as the correction value for the slant of the image plane of the exposure apparatus (step S1012), and this feedback is given to the product exposure in step S1001.

On the other hand, in case 2, the wafer is baked by changing the focus after confirming the focus (step S1013) and the best focus is found from the four corners by measuring the pattern line widths of the four corners provided in the periphery of the shot (step S1014). The slant amount of the image plane is calculated with the best focus of the four corners to obtain the correction value (step S1015). The correction value of the slant of the image plane is input into the exposure apparatus (step S1016) to give the feedback of the product exposure in the step S1001.

It is therefore possible to monitor the slant of the image plane with the marks formed by one baking.

In addition, it is possible to employ another fabrication method of the semiconductor device by combining the first embodiment (the method for monitoring the focus) and the second embodiment (the method for monitoring the slant of the image plane). That is to say, the mark used for the method of monitoring the slant of the image plane described in the second embodiment is configured to be a combination of the "remaining" and "removed" patterns to cancel the influence of the exposure amount on the mark size on the wafer. If the image plane is slanted on the wafer, there is a difference from the best focusing condition in the one-shot region projected on the image plane. The slant of the image plane is monitored by the method of monitoring in accordance with the present invention and the focus adjustment of the focus monitoring method in accordance with the present invention are alternately repeated so that the image plane may be automatically corrected to set the image plane of the exposure apparatus flat relative to the optical system of the exposure apparatus.

The monitoring method as described herein may be employed for the automatic control of the exposure apparatus as a computer program.

The present invention is also capable of advantageously performing the focus adjustment immediately by baking the pattern (mark) on the wafer in practice and monitoring the slant of the image plane in the shot region with only one baking.

What is claimed is:

1. A method of fabricating a semiconductor device comprising the steps of:
    forming at least one pair of first and second patterns on a wafer, the first pattern having an unexposed region surrounded by an exposed region, the second pattern having an exposed region surrounded by an unexposed region;
    checking a focusing condition on exposure by measuring widths of the first and second patterns formed on the wafer to determine whether there is a point located on the wafer that meets a best focusing condition; and
    when determining that no point located on the wafer meets the best focusing condition, determining a slant of an image plane of the substrate in the exposed region.

2. The method as claimed in claim 1, wherein the step of checking comprises the step of measuring widths of each of the first and second patterns in mutually orthogonal directions.

3. The method as claimed in claim 1, further comprising the step of changing an exposing condition by using results of the step of checking the focusing condition on exposure.

4. A method for fabricating a semiconductor device comprising the steps of:
    forming at least one pair of first and second patterns on a wafer, the first pattern having an unexposed region surrounded by an exposed region and the second pattern having an exposed region surrounded by an unexposed region, wherein the at least one pair of first and second patterns are formed on the wafer by exposing a substrate on the wafer to electromagnetic radiation passing through a photomask having marks for monitoring formed thereon, each of the marks comprising the at least one pair of first and second patterns; and
    checking a focusing condition on exposure by measuring widths of the first and second patterns formed on the wafer, wherein the step of checking the focusing condition on exposure comprises the steps of:
    determining whether there is a point located in an exposed region on the wafer that meets a best focusing condition by measuring sizes of the marks; and
    determining a slant of an image plane of the substrate in the exposed region by converting the sizes of the marks into displacements when there is no point in the exposed region that meets the best focusing condition.

5. The method as claimed in claim 4, further comprising the step of changing the sizes of marks for monitoring to displacements in a vertical direction and inverting signs of the displacements to thus determine the slant of the image plane in the exposed region when there is a point that meets the best focusing condition.

6. The method as claimed in claim 4, wherein the step of determining the slant of the image plane comprises the step of subjecting the displacements to least squares approximation to obtain the slant of the image plane.

7. A computer program product for use in fabrication of a semiconductor device comprising the steps of:
    forming at least one pair of first and second patterns on a semiconductor wafer, the first pattern having an unexposed region surrounded by an exposed region, the second pattern having an exposed region surrounded by an unexposed region;
    checking a focusing condition on exposure by measuring widths of the first and second patterns formed on the semiconductor wafer to determine whether there is a point located on the wafer that meets a best focusing condition; and
    when determining that no point located on the wafer meets the best focusing condition, determining a slant of an image plane of the substrate in the exposed region.

* * * * *